United States Patent
Nosker et al.

(10) Patent No.: US 9,422,423 B2
(45) Date of Patent: Aug. 23, 2016

(54) COMPOSITE ARTICLES COMPRESSION MOLDED FROM RECYCLED PLASTIC

(71) Applicant: Rutgers, The State University of New Jersey, New Brunswick, NJ (US)

(72) Inventors: Thomas Nosker, Stockton, NJ (US); Jennifer Lynch, Franklin Park, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 0 days.

(21) Appl. No.: 13/826,969

(22) Filed: Mar. 14, 2013

(65) Prior Publication Data
US 2014/0150842 A1    Jun. 5, 2014

Related U.S. Application Data

(60) Provisional application No. 61/733,083, filed on Dec. 4, 2012.

(51) Int. Cl.
| | |
|---|---|
| *C08L 23/06* | (2006.01) |
| *B32B 27/32* | (2006.01) |
| *B32B 5/18* | (2006.01) |

(Continued)

(52) U.S. Cl.
CPC . *C08L 23/06* (2013.01); *B32B 5/18* (2013.01); *B32B 27/065* (2013.01); *B32B 27/08* (2013.01); *B32B 27/20* (2013.01); *B32B 27/32* (2013.01); *C08K 3/40* (2013.01); *C08K 7/14* (2013.01); *C08K 9/08* (2013.01); *H01L 31/049* (2014.12); *B29B 17/0042* (2013.01); *B29C 43/003* (2013.01); *B29K 2105/26* (2013.01); *B32B 2262/101* (2013.01); *B32B 2264/101* (2013.01); *B32B 2270/00* (2013.01); *B32B 2272/00* (2013.01); *B32B 2307/102* (2013.01); *B32B 2419/00* (2013.01); *B32B 2607/00* (2013.01); *Y02B 10/12* (2013.01); *Y02E 10/50* (2013.01); *Y02W 30/62* (2015.05); *Y10T 428/24479* (2015.01); *Y10T 428/24628* (2015.01); *Y10T 428/249993* (2015.04); *Y10T 428/31938* (2015.04)

(58) Field of Classification Search
CPC ............ C08L 23/06; C08K 3/40; C08K 9/08; C08K 7/14; B32B 27/32; B32B 5/18; B29K 2105/26; B29B 17/0042
See application file for complete search history.

(56) References Cited

U.S. PATENT DOCUMENTS

| | | |
|---|---|---|
| 5,075,051 A | 12/1991 | Ito et al. |
| 5,120,776 A * | 6/1992 | Raj et al. .......................... 524/13 |

(Continued)

OTHER PUBLICATIONS

International Search Report and Written Opinion issued Apr. 3, 2014, for Application No. PCT/US2013/072851.

(Continued)

*Primary Examiner* — Frances Tischler
(74) *Attorney, Agent, or Firm* — Fox Rothschild LLP

(57) ABSTRACT

Compression molded articles containing a polymer component and optionally distributed therein between about 1% and about 45% by weight of a glass bead or fiber reinforcing component based on the weight of the finished composite article, wherein the polymer component contains between about 80% and about 100% by weight of HDPE based on the weight of the polymer component, in which at least about 20% or more by weight of said HDPE is post-consumer HDPE. Plastic panels, uses thereof and methods of manufacturing are also disclosed.

20 Claims, 1 Drawing Sheet

(51) Int. Cl.
    *C08K 3/40*     (2006.01)
    *C08K 7/14*     (2006.01)
    *C08K 9/08*     (2006.01)
    *H01L 31/049*     (2014.01)
    *B32B 27/06*     (2006.01)
    *B32B 27/08*     (2006.01)
    *B32B 27/20*     (2006.01)
    *B29C 43/00*     (2006.01)
    *B29K 105/26*     (2006.01)
    *B29B 17/00*     (2006.01)

(56) References Cited

U.S. PATENT DOCUMENTS

| | | | |
|---|---|---|---|
| 5,298,214 | A | 3/1994 | Morrow et al. |
| 5,789,477 | A | 8/1998 | Nosker et al. |
| 6,191,228 | B1 | 2/2001 | Nosker et al. |
| 7,011,253 | B2 | 3/2006 | Nosker et al. |
| 7,795,329 | B2 | 9/2010 | Nosker et al. |
| 7,996,945 | B2 | 8/2011 | Nosker et al. |
| 8,008,402 | B2 | 8/2011 | Lynch et al. |
| 2002/0100860 | A1 | 8/2002 | Wieder |
| 2002/0147244 | A1 | 10/2002 | Kishbaugh et al. |
| 2005/0192403 | A1* | 9/2005 | Nosker .............. E01B 3/44 525/63 |
| 2009/0205278 | A1* | 8/2009 | Lynch et al. ........... 52/309.13 |
| 2009/0242655 | A1 | 10/2009 | Nosker et al. |
| 2010/0016515 | A1 | 1/2010 | Chaudhary et al. |
| 2010/0244297 | A1 | 9/2010 | Nishiyama |
| 2010/0319144 | A1 | 12/2010 | Nosker et al. |
| 2011/0143058 | A1 | 6/2011 | Nosker et al. |
| 2011/0262736 | A1 | 10/2011 | Sumi |
| 2011/0294917 | A1 | 12/2011 | Lynch et al. |
| 2011/0305886 | A1* | 12/2011 | Phan et al. ................ 428/201 |
| 2013/0008973 | A1 | 1/2013 | Nosker et al. |

OTHER PUBLICATIONS

International Search Report and Written Opinion issued Mar. 28, 2014, for Application No. PCT/US2013/072855.

* cited by examiner

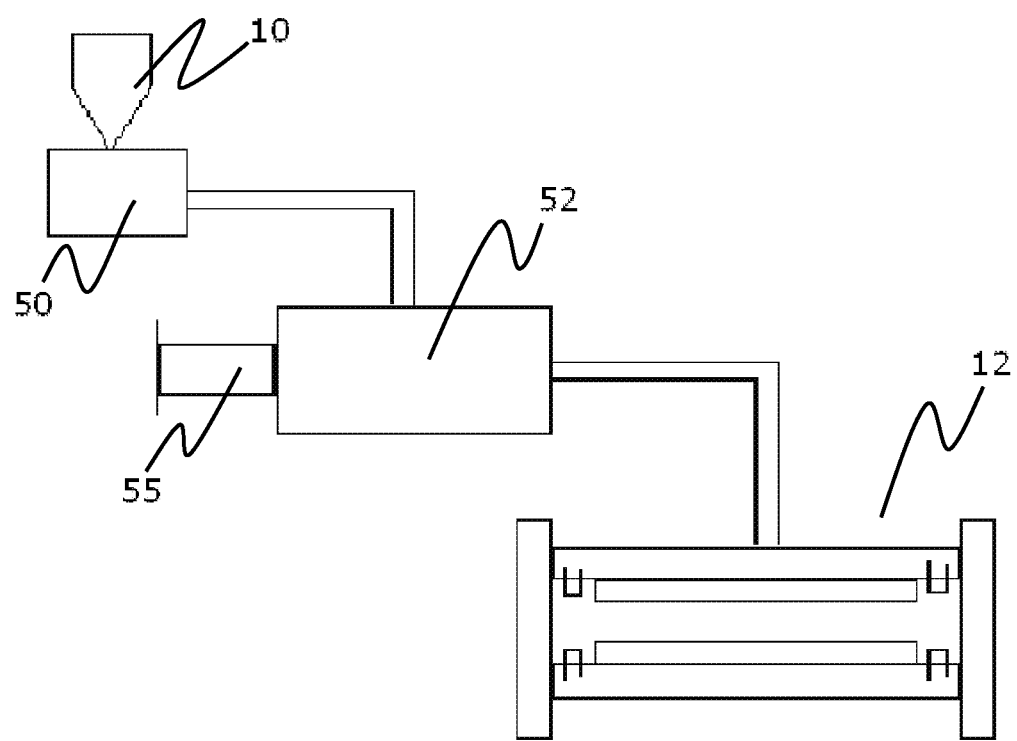

COMPOSITE ARTICLES COMPRESSION MOLDED FROM RECYCLED PLASTIC

CROSS-REFERENCE TO RELATED APPLICATIONS

This application claims the benefit of priority under 35 U.S.C. 119(e) of U.S. Provisional Application Ser. No. 61/733,083, filed on Dec. 4, 2012, the entire disclosure of which is incorporated herein by reference.

FIELD OF THE INVENTION

The present invention relates to fiber glass-enhanced polymer composite materials prepared from recycled plastics, processes of preparing these materials, and use of the materials for making articles having wide industrial applications.

BACKGROUND OF THE INVENTION

Plastics are ubiquitous and play important roles in industries as well as in people's daily life. Recycled plastic materials provide an inexpensive source of plastics. Proper recycling of plastic wastes and re-processing them into useful materials or articles can not only protect environments but may also create huge economic values. However, recycled plastics are often difficult to reformulate into useable products, especially products with consistent mechanical properties.

Recycled plastics are typically obtained by curbside collection, which itself presents problems as to quality and consistency. The types of plastic materials that are typically designated for curbside recycling are unpigmented high density polyethylene (HDPE) and polyethylene terephthalate (PET), which together constitute about 80% of the collected recycled plastics. Fortunately, some industries have standardized their plastic package materials. For example, plastic milk bottles are made from unpigmented HDPE, while plastic carbonated beverage bottles are made from PET (one-piece containers) or PET/HDPE (two-piece containers). These containers are easily identified and thus are relatively easy to segregate, thereby facilitating the recycling of these two plastics. This is the reason why these two types of plastic are designated for acceptable curbside recycling designated for resin recovery.

It has been demonstrated that recycled plastics, in particular polyolefins, such as HDPE, could be recycled and reprocessed to form useful materials with high economic value (see e.g., Nosker et al, U.S. Pat. Nos. 5,298,214; 5,789,477; 6,191,228; and 7,011,253, which are all incorporated herein by reference). However, new techniques in processing recycled plastics and turning them into useful materials with wider applications are still being actively pursued.

SUMMARY OF THE INVENTION

The present invention provides such another new technique in processing recycled plastics and converting them to useful materials for consumer and industrial use. The invention relates to a method of manufacturing plastic composite articles from recycled plastics and an optional glass bead or fiber reinforcing component, by processing them into composite panels and other useful articles. The manufacturing method involves an extrusion/compression molding process.

In one aspect the present invention provides a compression molded composite article comprising an HDPE polymer component and distributed therein between about 1% and about 45% by weight of a glass bead or fiber reinforcing component based on the weight of the finished composite article. Preferably, the polymer component contains between about 80% and about 100% by weight of HDPE based on the total weight of the polymer component, in which at least about 20% by weight or more of the HDPE is post-consumer HDPE.

In one embodiment, the composite article is a flat, square or rectangular sheet or panel.

In another aspect the present invention provides a compression molded polymer article comprising HDPE, wherein the article contains between about 80% and about 100% by weight of HDPE, in which at least about 20% by weight or more of the HDPE is post-consumer HDPE. In one embodiment, the polymer article is a flat, square or rectangular HDPE panel.

In another aspect, the present invention provides a laminate of two composite panels or HDPE panels sandwiching a third polymer layer. In one embodiment the third polymer layer is a polymer foam. The laminate can be dimensioned for and used as a truck or trailer bed, interior and exterior building walls, temporary structures, and the like.

In another aspect, the present invention provides thermoformed HDPE articles of predetermined shapes and thicknesses. In one embodiment the articles contain an HDPE polymer component and distributed therein between about 1% and 45% by weight of a glass bead or fiber reinforcing component based on the weight of the finished composite shape.

In another aspect, the present invention provides a corrugated panel thermoformed from an HDPE panel, or a composite panel containing an HDPE polymer component and distributed therein between about 1% and about 45% by weight of a glass bead or fiber reinforcing component based on the weight of the finished composite panel, as described above.

In another aspect, the present invention provides an embossed panel thermoformed from an HDPE panel, or a composite panel containing an HDPE polymer component and distributed therein between about 1% and about 45% by weight of a glass bead or fiber reinforcing component based on the weight of the finished composite panel, as described above.

In another aspect, the present invention provides a boat or aircraft hull thermoformed from an HDPE panel, or a composite panel containing an HDPE polymer component and distributed therein between about 1% and about 45% by weight of a glass bead or fiber reinforcing component based on the weight of the finished composite panel, as described above.

In another aspect, the present invention provides a reaction vessel thermoformed from an HDPE panel, or a composite panel containing an HDPE polymer component and distributed therein between about 1% and about 45% by weight of a glass bead or fiber reinforcing component based on the weight of the finished composite panel, as described above.

In another aspect, the present invention provides a solar panel comprising a plurality of solar cells disposed in a single layer on the surface of an HDPE panel, or a composite panel containing an HDPE polymer component and distributed therein between about 1% and about 45% by weight of a glass bead or fiber reinforcing component based on the weight of the finished composite panel, as described above.

In another aspect, the present invention provides a building integrated photovoltaic device comprising the solar panel as described above.

In another aspect, the present invention provides a method of making a plastic composite article comprising the steps of:

(a) making a mixed melt of a polymer component and optionally between about 1% and about 45% by weight of a glass bead or fiber reinforcing component based on the weight of the mixed melt, wherein the polymer component contains between about 80% and about 100% by weight of HDPE based on the weight of the polymer component, in which at least about 20% by weight or more of the HDPE is post-consumer HDPE;

(b) transferring the mixed melt to a machine press with a forming die with a cavity dimensioned to produce the plastic composite article, wherein the mixed melt is delivered to the cavity in a quantity sufficient to form the plastic composite article;

(c) compressing the mixed melt in the forming die with the machine press to form the plastic composite article; and (d) cooling the plastic composite article.

In another aspect, the present invention provides a method of increasing the modulus of a recycled plastic article formed from a mixed melt of a post-consumer HDPE polymer component containing an amount of one or more polymers selected from polyethylene (PE), polypropylene (PP) and low density polyethylene (LDPE) that is sufficient to reduce the modulus of the article below 150,000 psi, wherein the method adds to the HDPE polymer component, prior to the formation of the mixed melt, an amount of a radical initiator effective to provide an article with a modulus greater than 150,000 psi.

These and other aspects of the present invention will be better appreciated by reference to the following drawings and detailed description.

BRIEF DESCRIPTION OF THE DRAWINGS

FIG. 1 illustrates an extrusion/compression molding process and equipment setup for preparation of the plastic composite panels.

DETAILED DESCRIPTION OF THE INVENTION

The present invention relates to a method of manufacturing plastic composite articles from recycled plastics and optional reinforcing glass beads or fibers, and processing them into composite panels and other useful articles having wide application. The manufacturing method involves an extrusion/compression molding process.

Plastic polymers and plastic composite materials offer a viable alternative to wood and concrete. Manufactured plastic composites can exhibit the necessary stiffness strength, resistance to heat expansion and deformation, as well as increased resistance to degradation from moisture, excessive sunlight and attacks by microorganisms and insects. Plastic panels would also have a longer expected service life thereby reducing the labor and material costs associated with replacement.

However, the cost of raw materials is a disadvantage of plastic polymers and plastic composites. Virgin polymer resins can be quite expensive, thereby often making their use economically unfeasible. In the present invention, recycled polyolefins, in particular HDPE, is used to form glass bead- or fiber-enhanced composite panels and a wide range of industrial articles.

One aspect the present invention provides a composite article. In one embodiment of this aspect, the composite article contains a polymer component and distributed therein between about 1% and about 45% by weight of a glass bead or fiber reinforcing component based on the weight of the finished composite article, wherein the polymer component contains between about 80% and about 100% by weight of HDPE based on the weight of the polymer component, in which at least about 20% by weight or more of said HDPE is post-consumer HDPE.

In another embodiment of this aspect, the polymer component includes between about 90% and about 100% HDPE by weight. In another embodiment of this aspect, 100% of the HDPE in the polymer component is post-consumer HDPE. In another embodiment of this aspect, 100% of the polymer component is post-consumer polymers. Post-consumer plastic for the HDPE component can be obtained from the recycled HDPE beverage containers and other containers (e.g., 5 gallon pails and 55 gallon drums). Post-consumer fiber glass-filled HDPE, such as bumper covers from cars, can also be used.

In another embodiment of this aspect, the composite article further contains up to about 20% by weight, based on the weight of the polymer component, of at least one post-consumer polymer selected from PE, PP and LDPE.

In another embodiment of this aspect, the glass bead or fiber reinforcing component is present in an amount between about 10% and about 30% by weight based on the weight of the finished composite article. In another embodiment the glass bead or fiber reinforcing component in present in an amount that is between about 15% and about 25% by weight based in the weight of the finished composite article.

In another embodiment of this aspect, the fiber component has a minimum length of 0.1 mm. In another embodiment of this aspect, the fiber component comprises torrefied wood, rock wool or fiber glass. Glass beads and fiber glass have radiative heat transfer properties and their incorporation reduces the thermal expansion coefficient of articles formed from the melt mixture while increasing stiffness. The glass beads and fiber glass can also serve as a fire retardant, for which halogenated products are typically used. Replacement of halogenated products with fiber glass as fire-retardants also reduces potential exposure of people to hazardous halogenated products produced when retarding combustion, which are known to be dangerous to health. Glass beads and fiber glass are also advantageous compared to metal hydroxide fire retardants, because metal hydroxides release $H_2O$ when heated.

In one embodiment, greater than about 20% by weight of the finished composite material is glass bead or fiber reinforcing component or a mixture thereof, and the material is fire retardant. In another embodiment, greater than 25% by weight of the finished composite material is fiber glass. In one embodiment, nano fiber glass or glass microbeads can be added to composites to make the articles flame retardant while reducing the weight of the material. This is particularly useful in maritime use, because lowering the weight of a ship can increase payload capacity. In another embodiment of this aspect, the fiber glass is thermoplastic coated fiber glass.

Glass fibers are abrasive, and equipment wear increases linearly when glass fiber is in the range of about 10 wt. % to about 30 wt %. However, equipment wear increases exponentially when glass fiber content is above 30 wt %. Therefore, it is preferable that glass fibers not be added in amounts of more than 30 wt %.

In another embodiment of this aspect, the source of between about 10% and 100% by weight of the thermoplastic-coated fiber glass component based on the weight of the fiber glass component is fiber glass-reinforced HDPE, PE, PP, LDPE or mixtures of two or more thereof, which is also the source of between about 50% and about 75% by weight of the polymer component based on the weight of the polymer component.

In another embodiment of this aspect, the composite article has a modulus greater than 150,000 psi and an ultimate strength greater than 3000 psi. Preferred embodiments have a modulus greater than about 160,000 psi and an ultimate strength greater than about 3600 psi.

In another aspect, the present invention provides a corrugated panel thermoformed from a panel containing a polymer component and optionally distributed therein between about 1% and about 45% by weight of a glass bead or fiber reinforcing component based on the weight of the finished panel, wherein the polymer component contains between about 80% and about 100% by weight of HDPE based on the weight of the polymer component, in which at least about 20% or more by weight of said HDPE is post-consumer HDPE.

In another aspect, the present invention provides an embossed panel thermoformed from a panel containing a polymer component and optionally distributed therein between about 1% and about 45% by weight of a glass bead or fiber reinforcing component based on the weight of the finished panel, wherein the polymer component contains between about 80% and about 100% by weight of HDPE based on the weight of the polymer component, in which at least about 20% or more by weight of said HDPE is post-consumer HDPE.

In another aspect, the present invention provides a boat or aircraft hull thermoformed from a panel containing a polymer component and optionally distributed therein between about 1% and about 45% by weight of a glass bead or fiber reinforcing component based on the weight of the finished composite panel, wherein the polymer component contains between about 80% and about 100 wt. % of HDPE based on the weight of the polymer component, in which at least about 20% or more by weight of said HDPE is post-consumer HDPE.

In another aspect, the present invention provides a reaction vessel thermoformed from a panel containing a polymer component and optionally distributed therein between about 1% and about 45% by weight of a glass bead or fiber reinforcing component based on the weight of the finished composite panel, wherein the polymer component contains between about 80% and about 100% by weight of HDPE based on the weight of the polymer component, in which at least about 20% or more by weight of said HDPE is post-consumer HDPE.

In another aspect, the present invention provides a laminate of two panels sandwiching a third polymer layer. The two panels are up to about 30 mm thick, and the middle layer is up to about 100 mm thick. In one embodiment, the two panels are between about 1 to about 12 mm thick and the middle layer is between about 10 and about 50 mm thick. In another embodiment, the two panels are about 2 to about 9 mm thick and the middle layer is between about 20 and about 40 mm thick. In a more preferred embodiment, two composite panels are about 3 to about 6 mm thick and the middle layer is between about 25 and about 35 mm thick. In another embodiment the third polymer layer is a polymer foam. The laminate can be dimensioned for and used as a truck or trailer bed, interior and exterior building walls, temporary structures, and the like.

A person of ordinary skill in the art would know how to thermoform the panels of the present invention into corrugated panels, boat hulls, reaction vessels, etc. without undue experimentation. Thermoforming is a manufacturing process where a plastic sheet is heated to a pliable forming temperature, formed to a specific shape in a mold, and trimmed to create a usable product. The sheet, or "film" when referring to thinner gauges and certain material types, is heated in an oven to a high-enough temperature that it can be stretched into or onto a mold and cooled to a finished shape. This technique can be used to form, for example, automotive frames and other automotive components from the composite panels of the invention.

In another aspect, the present invention provides a solar panel comprising a plurality of solar cells disposed in a single layer on the surface of a panel containing a polymer component and optionally distributed therein between about 1% and about 45% by weight of a glass bead or fiber reinforcing component based on the weight of the finished composite panel, wherein the polymer component contains between about 80% and about 100% by weight of HDPE based on the weight of the polymer component, in which at least about 20% or more by weight of said HDPE is post-consumer HDPE.

In another aspect, the present invention provides a building integrated photovoltaic device comprising the solar panel described above.

In one embodiment of this aspect, the building integrated photovoltaic device is a roofing panel or shingle or a building facade panel. A person of ordinary skill in the art would recognize how to form the panels of the invention into these articles by using common knowledge or techniques known in the field, for example, by modifying the compression mold to obtain desired dimensions or shape of the panel, or by resizing or reshaping it after it is formed.

In another aspect, the present invention provides a method of making a plastic article comprising the steps of:
(a) making a mixed melt of a polymer component and optionally between about 1% and about 45% by weight of a fiber component based on the weight of the mixed melt, wherein the polymer component contains between about 80% and about 100% by weight of HDPE based on the weight of said polymer component, in which at least about 20% or more by weight of the HDPE is post-consumer HDPE;
(b) transferring the mixed melt to a machine press with a forming die with a cavity dimensioned to produce the plastic article, wherein the mixed melt is delivered to the cavity in a quantity sufficient to form a plastic article;
(c) compressing the mixed melt in the forming die with the machine press to form the plastic article; and
(d) cooling the plastic article.

In one embodiment of this aspect, the cavity is a square or rectangular cavity and the plastic article is a plastic composite panel.

In another embodiment, the mixed melt is formed in an extruder. In a more specific embodiment, of this aspect, the extruder is a twin screw extruder. In another embodiment the extruder is a single screw compounding extruder. Preferred single screw compounding extruders include a Model Taskmaster 1000 single screw compounding extruders manufactured by Randcastle Extrusion Systems, Inc. of Cedar Grove, N.J.

An illustrative, non-limiting example of the process for making a plastic composite article, for example, a panel, is illustrated in FIG. 1. Plastic materials and glass fibers in a desired weight ratio are introduced via hopper 10 into an extruder, 50, in which the plastics are melted and mixed with the glass fibers. The mixed melt is extruded into an accumulator, 52, from which the mixed melt is pushed into a mold, 12, through a conducting pipe by a piston, 55. In the mold, the mixed melt is pressed or molded into a desired shape of composite article and subsequently cooled down for release and/or for further processing. Optionally, a free radical initiator can also be incorporated into the mixture of plastic materials and glass fibers, vide infra.

In another embodiment of this aspect, the mixed melt is delivered from an extruder to a heated vessel until a quantity of the mixed melt sufficient to form a composite plastic article accumulates, after which the quantity is delivered to the cavity of the forming die.

While the HDPE polymer component can be obtained from virgin materials, it is preferably obtained from recycled plastics. European scrap contains mixtures of HDPE contaminated with medium and low density PE, even though the scrap is labeled HDPE, containing little to no glass fiber, thus producing articles having a 130,000 psi modulus and lower and ultimate strength of 2000-2500 psi.

Adding glass fiber or beads will not sufficiently raise the ultimate strength or modulus for structural applications. To increase the ultimate strength and modulus adequately when low to medium density polyethylene materials are present, a free radical initiator is added to the melt mixture during compounding in the manufacturing process. An olefin monomer, such as maleic anhydride, or a vinyl monomer, such as styrene or divinyl benzene, can also be added to graft-polymerize onto or cross-link with the polyethylene chain to enhance modulus and tensile strength. It also increases the polarity of the polymer to the extent that the shear stress between any glass present and the polymer matrix is increased, which further contributes to increasing the modulus and ultimate strength of the formulation, even with lower aspect ratio fibers.

The addition of the olefin or vinyl monomer also serves to couple the glass fiber to the polymer phase in the composite material, which also contributes to improvement of the modulus and ultimate strength of articles formed form the composition. It should be noted, however, that the addition of free radical initiator and optional grafting or cross-linking monomers will improve the mechanical performance of recycled HDPE contaminated with lower density polyethylene even when glass fibers are not used.

Suitable free radical initiators include, but are not limited to, organic peroxides, for example, di-tert-butyl peroxide (tBuOOtBu), dibenzoyl peroxide (($PhCOO)_2$) and dicumyl peroxide. Suitable monomers as grafting or cross-linking monomers also include, but are not limited to, olefins in general, and olefinic acid anhydrides in particular, such as maleic anhydride, as well as vinyl monomers such as styrene, divinyl benzenes, and the like. Suitable combinations of dicumyl peroxide and maleic anhydride for the present invention are commercially available.

Accordingly, in another embodiment of this aspect, the polymer component contains up to about 20% by weight, based on the weight of the polymer component, of at least one post-consumer polymer selected from PE, PP and LDPE, and the method further includes the step of adding to the polymer component, prior to the formation of the mixed melt, an amount of a radical initiator effective to provide a composite plastic article with a modulus greater than 150,000 psi. In another embodiment, the amount of free radical initiator added is effective to provide a modulus greater than 160,000.

The actual amount of radical initiator will vary with the waste stream and depend upon the extent to which the waste stream is contaminated with LDPE, with higher levels of LDPE requiring more radical initiator. If too little is used, the resulting blend will have inadequate mechanical properties. If too much is used, the resulting blend will over-cross-link and not be thermoplastic. Nevertheless, additional embodiments of the present invention are envisioned in which the product is cross-linked beyond thermoplastic.

However, an improvement in modulus and ultimate strength is obtained with the addition of as little as 100 ppm of free radical initiator. In one embodiment, between about 0.05 and about 0.5 wt % of the radical initiator is used. In another embodiment, between about 0.1 and about 0.25 wt % of the radical initiator is used.

Thus, in one particular embodiment, recycled HDPE containing lower density polyethylene is mixed with glass beads or fibers, to which an olefin or vinyl monomer such as maleic anhydride, styrene or divinyl benzene and a free radical initiator such as dicumyl peroxide are added. In another embodiment of this aspect, the mixed melt is formed in an extruder and the radical initiator is added to the extruder.

When olefinic acid anhydrides such as maleic anhydride are used as the grafting or cross-linking monomer, the extruder residence time should be sufficient to produce a composite material with an acid number less than 8, as determined by ASTM D 1386. A residence time sufficient to produce an acid number less the 4 is preferred, with a residence time sufficient to produce an acid number less that one being even more preferred. This will vary depending upon the waste stream and equipment but can be determined by one of ordinary skill in the art without undue experimentation.

This aspect of the present invention can be applied to essentially any method of compounding recycled HDPE, optionally with glass beads or fibers, and optionally other virgin or recycled polymer components, wherein the HDPE is contaminated with lower density polyethylene yet a high modulus and ultimate strength is desired. Thus, free radical initiators and optional grafting or cross-linking monomers can be used when compounding the glass fiber-reinforced polystyrene-polyolefin composites of U.S. Pat. No. 5,298,214, or when compounding the glass fiber-reinforced HDPE building materials and railroad ties of U.S. Pat. No. 5,789,477. The free radical initiators and optional grafting or cross-linking monomers can also be used when compounding the glass fiber-reinforced polymer composite railroad ties and structural building forms containing HDPE and other optional polymers disclosed by U.S. Pat. Nos. 6,191,228; 7,011,253, 7,795,329, 7,996,945 and 8,008,402. The U.S. Pat. No. 7,996,945 discloses polymeric structural building beams, including I-beams, C-beams and T-beams. The disclosures of all of these patents are incorporated herein by reference.

The free radical initiators and optional grafting or cross-linking monomers can also be used when compounding the glass fiber-reinforced polymer composite railroad ties, marine pilings structural beams, telephone poles, blocks, beams, boards, sheets, panels and the like containing HDPE and other optional polymers disclosed by U.S. Patent Publication Nos. 20050192403; 20090242655, 20100319144, 20110143058, 20110265410, 20110294917 and 20130008973. The disclosures of all of these publications are incorporated herein by reference, In another embodiment, the polymer component of the mixed melt includes between about 90% and about 100% HDPE by weight. In another embodiment, 100% of the HDPE in the polymer component is post-consumer HDPE. In another embodiment of this aspect, 100% of the polymer component is post-consumer polymers.

In another embodiment of this aspect, the mixed melt further contains up to about 20% by weight, based on the weight of the polymer component, of at least one post-consumer polymer selected from PE, PP and LDPE.

In another embodiment of this aspect, the glass bead or fiber reinforcing component is present in an amount between about 10% and about 30% by weight based on the weight of the mixed melt. In another embodiment the glass bead or fiber reinforcing component in present in an amount that is about 15% to about 25% by weight based in the weight of the mixed melt.

In another embodiment of this aspect, the fiber component has a minimum length of 0.1 mm. In another embodiment of this aspect, the fiber component comprises torrefied wood, rock wool or fiber glass.

In another embodiment, a corona discharge device or an electron beam curing device is installed at the end of the process line to treat all output sheets to improve the adhesion of paints, coatings, foils and laminating.

In another embodiment of this aspect, the method further contains the step of thermoforming the plastic panel into a finished article. In another embodiment of this aspect, the finished article is selected from a corrugated panel, an embossed panel, a boat hull, an aircraft hull, an automotive frame and a reaction vessel.

In another aspect, the present invention provides a method of recycling a post-consumer plastic waste, the method comprises the steps of:
(a) recovering from the waste a fraction comprising between about 80% and about 100% by weight HDPE;
(b) making a mixed melt comprising said HDPE fraction and between about 1% and about 45% by weight of a glass bead or fiber reinforcing component based on the weight of said mixed melt;
(c) transferring the mixed melt to a machine press with a forming die having a cavity dimensioned to produce a plastic article, wherein the mixed melt is delivered to the cavity in a quantity sufficient to form a plastic composite article;
(d) compressing the mixed melt in the forming die with the machine press to form said plastic article; and
(e) cooling the plastic article.

In another embodiment of this aspect, the mixed melt is delivered from the extruder to a heated vessel until a quantity of the mixed melt sufficient to form a composite plastic article accumulates, after which the quantity is delivered to the cavity of the forming die.

In another embodiment of this aspect, the polymer component of the mixed melt includes between about 90% and about 100% HDPE by weight. In another embodiment of this aspect, 100% of the HDPE in the polymer component is post-consumer HDPE. In another embodiment of this aspect, 100% of the polymer component is post-consumer polymers.

In another embodiment of this aspect, the glass bead or fiber reinforcing component is present in an amount between about 10% and about 30% by weight based on the weight of the mixed melt. In another embodiment the glass bead or fiber reinforcing component in present in an amount between about 15% and about 25% by weight based in the weight of the mixed melt.

In another embodiment of this aspect, the fiber component has a minimum length of 0.1 mm. In another embodiment of this aspect, the fiber component comprises torrefied wood, rock wool or fiber glass.

In another embodiment, a corona discharge device or an electron beam curing device is installed at the end of the process line to treat all output sheets to improve the adhesion of paints, coatings, foils and laminating.

In another embodiment of this aspect, the method further contains the step of thermoforming the plastic panel into a finished article. In another embodiment of this aspect, the finished article is selected from a corrugated panel, an embossed panel, a boat hull, an aircraft hull, an automotive frame and a reaction vessel.

In another embodiment of this aspect, the HDPE fraction comprises up to about 20% by weight, based on the weight of said HDPE fraction, of at least one post-consumer polymer selected from PE, PP and LDPE, and the method further includes the step of adding to said HDPE fraction, prior to the formation of said mixed melt, an amount of a radical initiator effective to provide a composite plastic article with a modulus greater than 150,000 psi. In another embodiment, the radical initiator is added in an amount effective to provide a composite article with a modulus greater than about 160,000 psi.

In another embodiment of this aspect, the mixed melt is formed in an extruder and said radical initiator is added to said extruder. In another embodiment of this aspect, the free radical initiator is an organic peroxide. In another embodiment of this aspect, the organic peroxide is selected from dibenzoyl peroxide, dicumyl peroxide and di-t-butyl peroxide.

In another embodiment of this aspect, an olefin monomer capable of graft polymerization onto a polyethylene is added to said polymer component with the radical initiator. In a more specific embodiment the olefin monomer is maleic anhydride.

In another aspect, the present invention provides a method of increasing the modulus of a recycled plastic article formed from a mixed melt comprising a post-consumer HDPE polymer component containing an amount of one or more polymers selected from PE, PP and LDPE that is sufficient to reduce the modulus of the article below 150,000 psi, wherein the method adds to the HDPE polymer component, prior to the formation of the mixed melt, an amount of a radical initiator effective to provide an article with a modulus greater than 150,000 psi.

In one embodiment of this aspect, the radical initiator is an organic peroxide. In another embodiment of this aspect, the organic peroxide is selected from dibenzoyl peroxide, dicumyl peroxide and di-t-butyl peroxide.

In another embodiment of this aspect, an olefin monomer capable of graft polymerization onto a polyethylene is added to said polymer component with said radical initiator.

In another embodiment, the radical initiator is added in an amount effective to provide a composite article with a modulus greater than about 160,000 psi.

In another embodiment of this aspect, the mixed melt further contains up to about 20% by weight, based on the weight of the polymer component, of at least one post-consumer polymer selected from PE, PP and LDPE.

In another embodiment of this aspect, the glass bead or fiber reinforcing component is present in an amount between about 20% and about 30% by weight based on the weight of the mixed melt. In another embodiment the fiber component in present in an amount that is about 25% by weight based in the weight of the mixed melt.

In another embodiment of this aspect, the fiber component has a minimum length of 0.1 mm. In another embodiment of this aspect, the fiber component comprises torrefied wood, rock wool or fiber glass.

In another embodiment, a corona discharge device or an electron beam curing device is installed at the end of the process line to treat all output sheets to improve the adhesion of paints, coatings, foils and laminating.

In another embodiment of this aspect, the method further contains the step of thermoforming the plastic panel into a finished article. In another embodiment of this aspect, the finished article is selected from a corrugated panel, an embossed panel, a boat hull, an aircraft hull, an automotive frame and a reaction vessel.

In addition to the polyolefin and glass bead or fiber reinforcing components, the composite may contain further additives. For example, the material used to make the composite can contain small amounts of a blowing agent to reduce the number and size of voids formed within the material during cooling. The amount of can be, for example, less than 0.3 wt. %, e.g., about 0.03 wt. %. The blowing agent, e.g., azidocarbonamide, can be mixed in with the resin powder. Alternatively, other foaming agents or gases can be directly metered into the extruder. Conventional compounding additives can also be combined with the polymer(s) prior to extrusion. Suitable additives for the composite articles include pigments, UV resistant agents, colorants (such as carbon black), modifiers, fillers, particles, and the like.

The polymer component and any glass beads or fibers, together with any additives are fed to the barrel of the extruder in solid form with optional free radical initiator and olefin monomer at about 180-220° C. and 80 rpm or greater, with pressure depending on the die. In some embodiments, the melt mixture can be continuously extruded into the accumulator. The accumulator stores hot, compounded plastic and the optional glass beads or fibers and fills to the desired volume required to fill the mold. This allows all of the plastic to be molded to be deposited in the open mold over a very short period of time (a few seconds), to prevent air cooling, and allow a smaller extruder to be used than would otherwise be required. The capacity of the accumulator can be adjusted depending on need, which can be 30-35 lbs, for example. The accumulator ensures orientation of the fiber glass to be planar but not axial, thus avoiding the one directional orientation and becoming harder to propagate cracks. As known in the art, one-directional orientation of fibers would be easy to break or crack.

As also understood by a person of skill in the art, the size and shape the plastic composite sheets can be adjusted depending on applications. For example, the sheets can be rectangular having a 4×8 ($ft^2$) dimension, with 8 mm thickness. The length and width dimensions are determined by the dimensions of the die cavity of the compression mold, and the thickness is determined by the depth or volume of the die cavity and the amount of melt mixture added to the die, both of which can be modified based on need.

Compression molding further avoids single-directional orientation of fiber. Non-unidirectional orientation is also achieved by using a single-screw compounding extruder such as a Randcastle mixing device, which allows modulation of fiber glass levels, as disclosed in U.S. patent application Ser. No. 13/454,035, filed Apr. 23, 2012, the disclosure of which is hereby incorporated by reference. This application discloses a method of just in time compounding in which extruder-compounded compositions are directly fed to molding equipment.

The panels of the present invention has wide applications, for example, in building constructions, such as roofing, floor tiles, exterior and interior finishing products & siding, ceiling tiles, and shingles. The articles of the present invention are resistant to attack by microbes and insects and thus do not require expensive chemical treatments. Also the material is resistant to degradation from exposure to ultraviolet light as well as damp, freezing conditions.

EXAMPLES

Example 1

Starting Materials

Two components were used for the experimental mixing study, including fiberglass (FG) and recycled plastics. The FG is typical micron-sized E Glass (d=20 microns, L=4 mm). Recycled plastics include those containing high density polyethylene (HDPE) as the main component, for example, milk bottles, car bumpers, etc.

Product Description

Composite flat panel materials. In this definition, "flat panel" means a piece of material, having considerable extent of surface; usually a rectangular piece of greater length than breadth and distinguished by its thinness; being more than 4 inches in width and not more than 2.5 inches in thickness.

Blend/Formulation

Compatibalizers such as Fusabond®, or the like

Glass Fibers (long and short glass)

HDPE

Black concentrate—carbon black to make the product a black color, or other applicable colors PP/GF—to be mixed with the HDPE PP—to be mixed with the HDPE PS—to be mixed with the HDPE We use recycled plastic material, but can also use virgin plastics, if required Sheet Usages and Profile Application The sheet product is used in a variety of situations, and in many different sectors. This includes, but is not limited to, construction site hoardings, signage, concrete shuttering, rain cladding, cubicle partitions, pipe boxing, sound barriers (acoustic barriers etc.), and potential replacement for internal skin of walls, ceilings & flooring. The objective to replace timber-based products such as plywood, Medium Density Fiberboard (MDF) and compact grade laminated in a variety of situations A corona treatment process and/or Electron Beam Curing process is installed at the end of the process line to treat all output sheets to improve the adhesion of paints, coatings, foils and laminating. The compact grade alternative product is used for, but not limited to, laboratory furniture, lockers, external building cladding and washroom cubicles.

Manufacturing Stages

Product was manufactured according to the following stages:

Stage 1: Recycled HDPE Granulate was blown into fabric silos.

Stage 2: Recycled HDPE from several sources was mixed to average out inconsistencies in supplied material.

Stage 3: Material was blended with additional Glass Fiber, Carbon Black and additives.

Stage 4: Single Screw Extrusion—L/d 36:1 circa 120 mm diameter 350 kg output.

Production line used a long single screw extruder to compound our material blend. A screw of varying pitch and diameter was used to create conditions of shear, heat and pressure within the extruder. A vented extruder was used to allow volatiles, such as steam, to be removed from the plastic melt.

A water chiller unit was provided to supply temperature regulated cooling water to the extruder barrel.

Stage 5: Manifold/Accumulator Stores molten polymer between dispense cycles.

Post extrusion, the hot molten plastic/glass fiber mix was stored within an accumulator device. This accumulator is a steel cylinder, heated by electrical heater bands, where the molten material was stored until sufficient quantity accumulated to fill a mold tool cavity, when it was then discharged through a port using a pneumatically operated piston.

These accumulators are custom built devices for the use with the custom tool.

Stage 6: Tools preheated under Infrared Heaters.

The mold tools traversed around a conveyor line. The control system pre-set the output and duration of the Infra Red pre-heater and synchronized the movement of the tool into preheating.

Stage 7: Manifold/Accumulator dispensed measured charge weight into waiting open tool.

After the tool was preheated, the top half of the tool passed by the delivery point of the accumulator and was moved directly to the tool mating station where it was lifted and rotated prior to arrival of the lower half of the tool.

The preheated lower half of the tool moved under the outlet of the accumulator in synchronous movement with the accumulator piston, allowing a metered amount of material to be fed into position within the tool.

Stage 8: Tool upper and lower sections mated with hot plastic inside.

Stage 9: Filled tool moved to heated press.

The lower half of each tool was then mated with the top half and moved into a heated press where the molten plastic was squeezed between the top and lower tool halves until the tool is fully closed.

Stage 10: Filled tool moved to cooling conveyor.

After a short time under pressure in the press, the tool was moved to a cooling conveyor where it was cooled using ambient air, fans and water spray.

Stage 12: Product removed from tool, de-flashed.

After the tool and product within was cooled until rigid enough to be safely removed from the tool, the tool was opened by an operator using a small overhead crane unit. The product was lifted out and placed on a table where the operator inspected the product and removed excess flash with a heated knife.

Stage 13: Product corona treated to improve surface, and packed.

Quality approved products were then placed on the input conveyor of the Corona Discharge machine.

Example 2

British Recycled HDPE

Approximately 100 pounds of HDPE obtained from a recycler who collected the plastic at curbside in the UK and sorted out the bottles with the HDPE/2 recycling symbol on the bottom were obtained. The materials were shredded and injection molded into ASTM test bars, and the resulting properties revealed a modulus of about 100,000 psi, with very high ductility and strength at about 2,500 psi. This is indicative of a blend of medium and/or low density PE with HDPE, at some level in excess of a few percent. (Typical values of modulus and strength for HDPE raw materials are 160,000 and 3,600 psi, respectively.) When US sourced post consumer bottles are sorted the same way, the recycled materials behave substantially the same as virgin materials in terms of properties.

Example 3

Structural Sheet Samples

A structural sheet composite was formulated from fiberglass-reinforced recycled HDPE. The recycled HDPE used for this study was "British Recycled HDPE" (BR-HDPE), and the fiberglass was John Manville 4 mm chopped strand glass fibers (glass fiber). DuPont™ Fusabond® P353 (Fusabond), with a peroxide and maleic anhydride was used to assist in adjusting the mixed PE to become more like HDPE and improve the functionalization of the BR-HDPE. BR-HDPE was ground in a Nelmor Bulk Granulator to a ½" or smaller size, then dried at 186° F. for 2 hours prior to processing, since the sample was moist.

Weight percentages of 71% BR-HDPE, 25% glass fiber, and 4% Fusabond® were dry mixed together in several small 100 gram batches, shaken for one minute to promote consistent mixing, and consecutively fed into the hopper of a Negri Boss 50 tonne Injection Molding Machine.

The fed batches were processed in the Injection Molding Machine at 450° F. as described in FIG. 1, with an injecting pressure of 600 psi. The specimens produced had an average dimension according to FIG. 1 ((T)=3.55 mm, (W)=12.44 mm, (L)=126 mm). The produced specimens were allowed to normalize for 24 hours then mechanical testing was carried out on a MTS QTest/25 Universal test apparatus in accordance with ASTM D790 (Flexural testing mode). The mode testing conditions were done at a span of 54 mm and a strain rate of 1.42 mm/min.

It will be understood by those of skill in the art that numerous and various modifications can be made without departing from the spirit of the present invention. Therefore, it should be clearly understood that the various embodiments of the present invention described herein are illustrative only and not intended to limit the scope of the present invention. All references cited herein are incorporated by reference in their entirety. Citation of any patent or non-patent references does not constitute admission of prior art.

What is claimed is:

1. A method of increasing the modulus of a recycled plastic article formed from a mixed melt comprising (1) a post-consumer HDPE polymer component and (2) an amount of one or more polymers selected from the group consisting of PE, PP and LDPE that, in the absence of a radical initiator, is sufficient to reduce the modulus of said article below 150,000 psi, said method comprising adding to said HDPE polymer component (1), prior to the formation of said mixed melt with component (2), amounts of a radical initiator and an olefin monomer effective to graft polymerize or cross-link sufficient quantities of said PE, PP and/or LDPE with said HDPE to provide an article having a modulus greater than 150,000 psi.

2. The method of claim 1, wherein the radical initiator is an organic peroxide.

3. The method of claim 2, wherein the organic peroxide is selected from the group consisting of dibenzoyl peroxide, dicumyl peroxide, and di-t-butyl peroxide.

4. The method of claim 1, wherein said olefin monomer is maleic anhydride.

5. The method of claim 1, wherein the mixed melt further comprises up to about 20% by weight, based on the weight of said HDPE polymer component, of at least one post-consumer polymer selected from the group consisting of PE, PP and LDPE.

6. The method of claim 1, wherein the mixed melt further comprises between about 20% and about 30% by weight based on the weight of the mixed melt, of a glass bead or fiber reinforcing component.

7. The method of claim 6, wherein said fiber component has a minimum length of 0.1 mm.

8. The method of claim 1, further comprising the step of treating said recycled plastic article with a corona discharge or an electron beam.

9. The method of claim 1, wherein the recycled plastic article formed is a panel.

10. The method of claim 8, further comprising the step of thermoforming the panel into a finished article.

11. The method of claim 10, wherein the finished article is selected from the group consisting of a corrugated panel, an embossed panel, a boat hull, an aircraft hull, an automotive frame, and a reaction vessel.

12. The method of claim 1, wherein the recycled plastic article formed is a railroad tie.

13. The method of claim 1, wherein the recycled plastic article formed is a structural building form.

14. The method of claim 13, wherein the structural building form is selected from the group consisting of I-beams, T-beams, and C-beams.

15. The method of claim 1, wherein the amounts of said radical initiator and olefin monomer are effective to increase the modulus of said recycled plastic article when glass fibers or beads are not present.

16. The method of claim 1, wherein said mixed melt is free from a thermoplastic-coated glass bead component and a thermoplastic-coated fiber component.

17. A method of increasing the modulus of a recycled plastic article formed from a mixed melt consisting essentially of (1) a post-consumer HDPE polymer component and (2) an amount of one or more polymers selected from the group consisting of PE, PP and LDPE that, in the absence of a radical initiator, is sufficient to reduce the modulus of said article below 150,000 psi, said method consisting essentially of adding to said HDPE polymer component (1), prior to the formation of said mixed melt with component (2), amounts of a radical initiator and an olefin monomer effective to graft polymerize or cross-link sufficient quantities of said PE, PP and/or LDPE with said HDPE to provide an article with a modulus greater than 150,000 psi.

18. A method of increasing the modulus of a recycled plastic article formed from a mixed melt consisting of (1) a post-consumer HDPE polymer component and (2) an amount of one or more polymers selected from the group consisting of PE, PP and LDPE that, in the absence of a radical initiator, is sufficient to reduce the modulus of said article below 150,000 psi, said method consisting of adding to said HDPE polymer component (1), prior to the formation of said mixed melt with component (2), amounts of a radical initiator and an olefin monomer effective to graft polymerize or cross-link sufficient quantities of said PE, PP and/or LDPE with said HDPE to provide an article with a modulus greater than 150,000 psi.

19. The method of claim 6, wherein said glass bead or fiber reinforcing component is not thermoplastic-coated.

20. The method of claim 7, wherein said fiber component is not thermoplastic-coated.

* * * * *